United States Patent [19]

Berrian et al.

[11] 4,433,384
[45] Feb. 21, 1984

[54] PATTERN DATA HANDLING SYSTEM FOR AN ELECTRON BEAM EXPOSURE SYSTEM

[75] Inventors: Donald W. Berrian, Topsfield; Billy W. Ward, Rockport, both of Mass.

[73] Assignee: Varian Associates, Inc., Palo Alto, Calif.

[21] Appl. No.: 309,156

[22] Filed: Oct. 5, 1981

[51] Int. Cl.³ .................... G02B 27/00; H01J 37/00
[52] U.S. Cl. .................................. 364/525; 364/490; 250/492.2
[58] Field of Search ............................ 250/398, 492.2; 364/524, 525, 520

[56] References Cited

U.S. PATENT DOCUMENTS

| 3,900,737 | 8/1975 | Collier et al. | 250/492 A |
| 4,151,421 | 4/1979 | Sumi | 250/492.2 |
| 4,267,456 | 5/1981 | Hidai et al. | 250/492.2 |
| 4,280,186 | 7/1981 | Hidai et al. | 250/492.2 |

FOREIGN PATENT DOCUMENTS 64639 11/1982 European Pat. Off. .

OTHER PUBLICATIONS

Matsumoto et al., "Electron Beam Exposure System For LSI Mask and Reticle Fabrication," Toshiba Review, No. 119, Jan.-Feb. 1979.
Cannon et al., "Pattern Data Flow in the HP Electron Beam System," Hewlett-Packard Journal, May 1981.
Sumi et al., "Data Compaction Method For Raster-Scan Exposure System," J. Vac. Sci. Technol., vol. 16, No. 6, Nov./Dec. 1979, p. 1809.

*Primary Examiner*—Bruce C. Anderson
*Attorney, Agent, or Firm*—Stanley Z. Cole; William R. McClellan

[57] ABSTRACT

A pattern data handling system for an electron beam exposure system wherein figure data conversion is performed simultaneously with irradiation of a workpiece, thereby providing high speed operation. Figure data, containing figure descriptions for a stripe area, is subdivided into blocks of segment figure data and is stored in a pattern data memory. Multiple pattern generators, each including a bit map memory, simultaneously convert blocks of segment figure data to bit maps and store the bit maps in their respective bit map memories. The bit maps are transferred out of the bit map memories and through a shift register one at a time to provide continuous beam blanking data. The system is particularly useful for electron beam exposure of reticles which are characterized by little or no repetition of features and by relatively large features.

14 Claims, 12 Drawing Figures

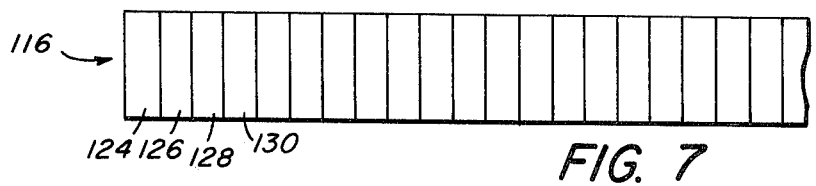
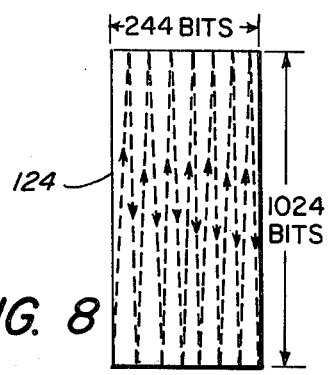
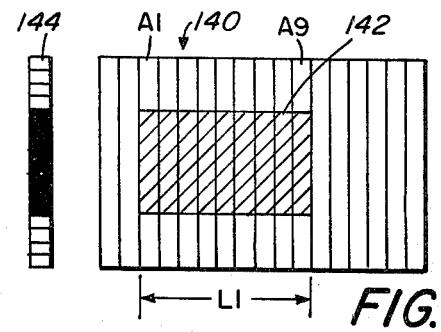
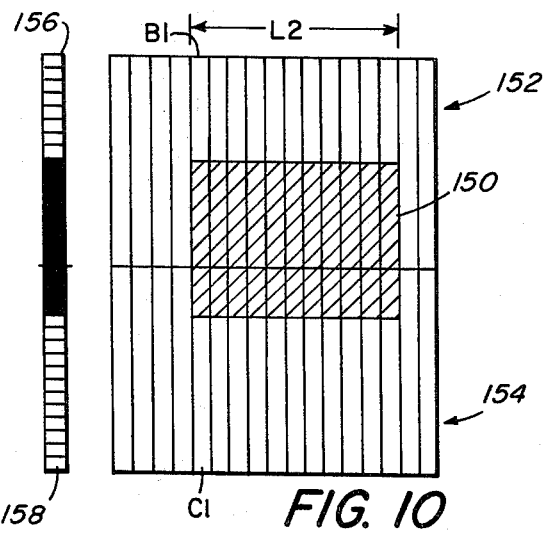
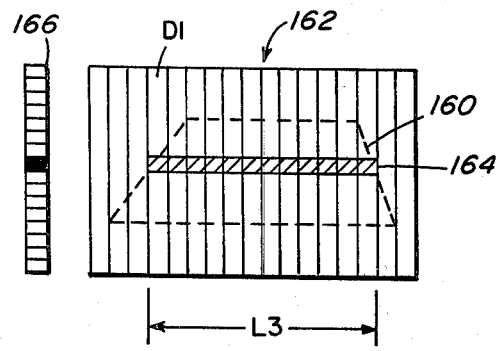
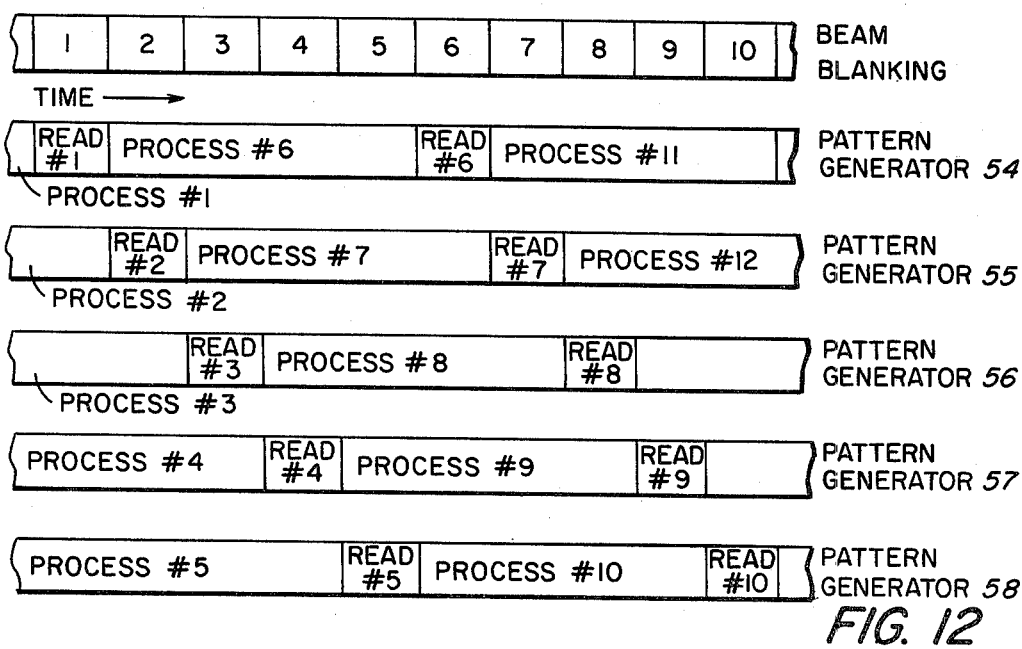

PATTERN DATA HANDLING SYSTEM FOR AN ELECTRON BEAM EXPOSURE SYSTEM

BACKGROUND OF THE INVENTION

This invention relates to electron beam exposure systems for selectively irradiating workpieces and, more particularly, to a pattern data handling system for providing beam blanking data for an electron beam exposure system.

Electron beam exposure systems have been developed for use in the manufacture of microminiature semiconductor devices. A pattern is produced in a mask or a semiconductor wafer coated with an electron resist material by exposure to an electron beam. In the exposure of a pattern, an electron beam is scanned across the surface of a workpiece positioned perpendicular to the direction of the beam. As the beam is scanned across the surface of the workpiece, it is turned on and off, or blanked, to produce the desired pattern. In order to minimize pattern distortion, the deflection of the electron beam is limited and the workpiece is mechanically positioned under the beam by a moving stage. The electron beam is scanned in the y direction and the stage moves in the x direction so that a stripe of the workpiece is scanned. By additional stage movements, multiple abutting stripes are scanned until the entire workpiece has been scanned. Thus, while the electron beam scanning range may be one millimeter, the moving stage permits exposure of a workpiece several inches square. Such a system is described in U.S. Pat. No. 3,900,737 issued Aug. 19, 1975 to Collier et al.

As might be expected, large quantities of data are required to describe a complex pattern on a microminiature semiconductor device. For example, when a 0.5 micrometer electron beam is utilized, one million bits of data are required to raster scan a pattern only 0.5 millimeter on a side. The data describing the pattern to be exposed is typically stored on magnetic tape or disk in the form of figure data, which specifies the location, size, and shape of the various features. In a raster scan system, conversion of figure data to a bit map image of the area to be exposed is required prior to writing of the pattern. The time required for conversion of figure data can be considerable.

In the exposure of 1X (actual size) masks or semiconductor wafers, the die pattern is repeated 25 to 100 times. Prior art systems have taken advantage of this repetition of patterns to reduce the total time spent in figure data conversion. Figure data for a stripe or a portion of a stripe is converted to a bit map once and then the corresponding stripe is exposed on each of the 25 to 100 die. Using this approach, the figure data conversion time is typically 10% to 25% of the total time to expose a workpiece.

It has become desirable to fabricate reticles using electron beam exposure systems. A reticle is a type of mask which is 5X (five times) or 10X (ten times) the actual device size and which contains one, or at most several, die, or repetitions of the pattern. The reticle is later used in a wafer stepper system to fabricate device layers in semiconductor wafers one or several die at a time. When an electron beam exposure system is used commercially for fabrication of reticles, an operating parameter of major importance is throughput in terms of reticles completed per unit time.

The lack of pattern repetition inherent in reticles causes an increase in time required for figure data conversion in prior art systems. Furthermore, the features on a 5X or 10X reticle are larger than the features on a 1X mask and require more bits in a bit map. Since the figure data is converted bit by bit, more time is spent in conversion of larger features. The overall effect is to drastically increase the figure data conversion time when prior art systems are used to fabricate reticles. Figure data conversion can take several times as long as actual writing time.

It is an object of the present invention to provide a pattern data handling system which provides high speed beam blanking data for an electron beam exposure system.

It is another object of the present invention to provide a pattern data handling system which can provide continuous beam blanking data for an electron beam exposure system.

It is yet another object of the present invention to provide a pattern data handling system for an electron beam exposure system wherein writing continues during bit map generation.

It is still another object of the present invention to provide a pattern data handling system for an electron beam exposure system wherein beam blanking data for reticles can be efficiently provided.

SUMMARY OF THE INVENTION

According to the present invention these and other objects and advantages are achieved in a pattern data handling system for providing beam blanking data for an exposure system in which a beam selectively irradiates multiple abutting stripe areas of a workpiece. The pattern data handling system includes memory means for storage of figure data which describes features of a pattern to be irradiated. The figure data is subdivided into multiple blocks of segment figure data, each corresponding to a segment of one of said stripe areas. The pattern data handling system further includes means for simultaneously converting at least one of the blocks of segment figure data to a bit map containing beam blanking information for the respective segment and serializing beam blanking information in another bit map to provide continuous beam blanking data. Figure data conversion is therefore performed simultaneously with irradiation of the workpiece.

According to another aspect of the present invention, there is provided a method for generating beam blanking data. The method includes the step of storing figure data in a random access memory in which the figure data is subdivided into multiple blocks of segment figure data. The method further includes the step of converting at least one of the blocks of segment figure data to a bit map containing beam blanking information for the respective segment and simultaneously, serializing beam blanking information in another bit map to provide continuous beam blanking data. According to the method, figure data conversion is performed simultaneously with irradiation of the workpiece.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIGS. 6-8 illustrate the exposure of a workpiece in accordance with the present invention;

FIGS. 9-11 illustrate the generation of bit maps in accordance with the present invention; and FIG. 12 is a timing diagram illustrating the operation of the pattern generators shown in FIG. 4.

Figure 1:
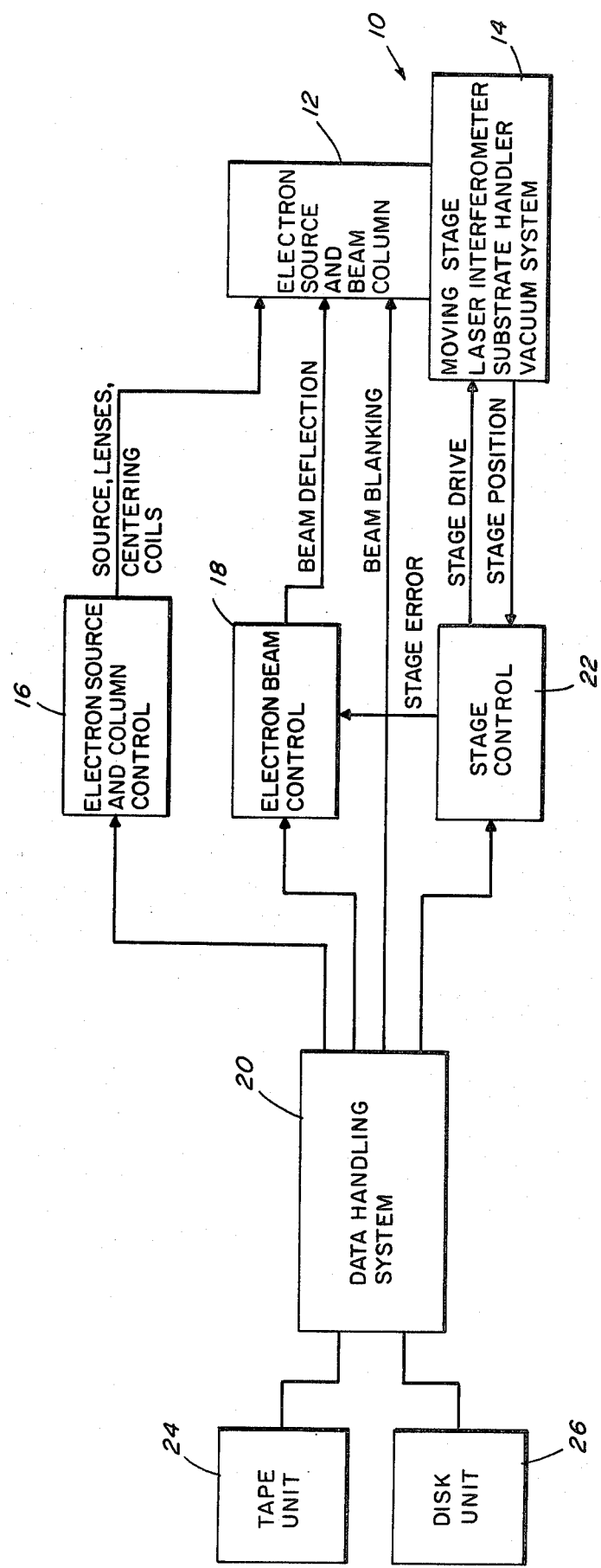
FIG. 1 is a block diagram of an electron beam exposure system.

DETAILED DESCRIPTION OF THE INVENTION a. Description of an electron beam exposure system An electron beam exposure system is shown in block diagram form in FIG. 1. A writing module 10 includes a column 12 mounted on a base 14. The column 12 includes an electron source and a beam column with apertures for shaping the beam, lenses for focusing the beam, blanking plates, centering coils and scanning coils. The source, lenses, and centering coils receive power and control signals from an electron source and column control 16. The scanning coils receive beam deflection signals from an electron beam control 18. The blanking plates receive a beam blanking signal from a data handling system 20. The base 14 includes a moving stage and associated drive motors which position a workpiece under the electron beam and move the workpiece as exposure progresses. The base 14 also includes a laser interferometer which accurately measures the position of the workpiece and a vacuum system which maintains the electron source, the beam column and the chamber in which the workpiece is located at high vacuum. The drive motors for the moving stage receive stage drive signals from a stage control 22. Stage position signals from the laser interferometer are sent to the stage control 22. The data handling system 20 controls the operation of the system by providing control signals to the electron source and column control 16, the electron beam control 18 and the stage control 22. In addition, the data handling system 20 processes pattern data from a tape unit 24 or a disk unit 26 and provides beam blanking signals. Software for controlling the operation of the system is stored in the disk unit 26. Suitable writing modules and associated control electronics are known and are commercially available. A data handling system in accordance with the present invention is described in detail hereinafter.

In operation, the column 12 generates an electron beam which is scanned over a workpiece coated with an electron resist material and is turned on and off, or blanked, to produce the desired exposure pattern on the workpiece. While the electron beam has a scan field limited to about one millimeter, the moving stage permits exposure of a relatively large workpiece.

b. Description of a prior art data handling system

Figure 2:
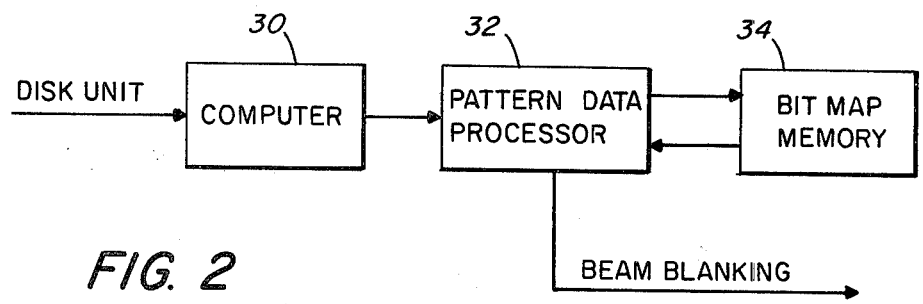
FIGS. 2 and 3 illustrate a prior art data handling system.

A pattern data handling system in accordance with the prior art is shown in block diagram form in FIG. 2. A pattern to be exposed is stored in the form of figure data on magnetic disk. Figure data describes the features of the pattern in terms of location, size, and shape. A block of figure data is transferred by a general purpose computer 30 from the disk unit to a pattern data processor 32 which converts the figure data to a bit map image of the pattern to be exposed and stores the bit map in a bit map memory 34. After conversion of the figure data, the bit map is transferred back through the pattern data processor 32 to provide beam blanking data.

Figure 3:
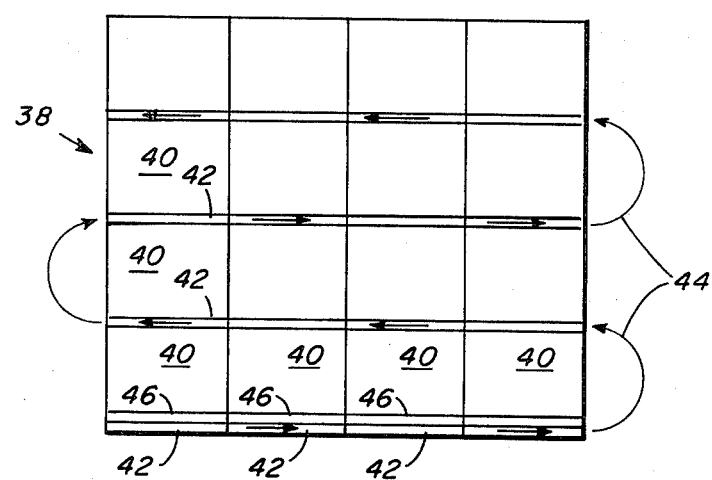

An example of a 1X mask illustrating a prior art writing technique is shown in FIG. 3. The mask 38 includes a number of identical die 40. The scanning electron beam operates in conjunction with the moving stage to provide exposure of a stripe 42 of each die 40. The moving stage imparts to the mask 38 a serpentine movement, as indicated by the arrows 44, so that all stripes 42 on the mask 38 are exposed in sequence. Thus, figure data for the stripe 42 is converted to a bit map once and the bit map is repeatedly read out until all stripes 42 have been exposed. Next, figure data for a stripe 46 abutting the stripe 42 is converted to a bit map and then all stripes 46 on the mask 38 are exposed. The process of stripe scanning is repeated until the entire mask has been exposed. In the above-described system, figure data conversion and exposure of the workpiece are performed in sequence so that figure data conversion time adds directly to the total workpiece processing time. Advantage is taken of the repetition of patterns to reduce the total figure data conversion time.

c. Description of data handling system according to the invention

Figure 4:
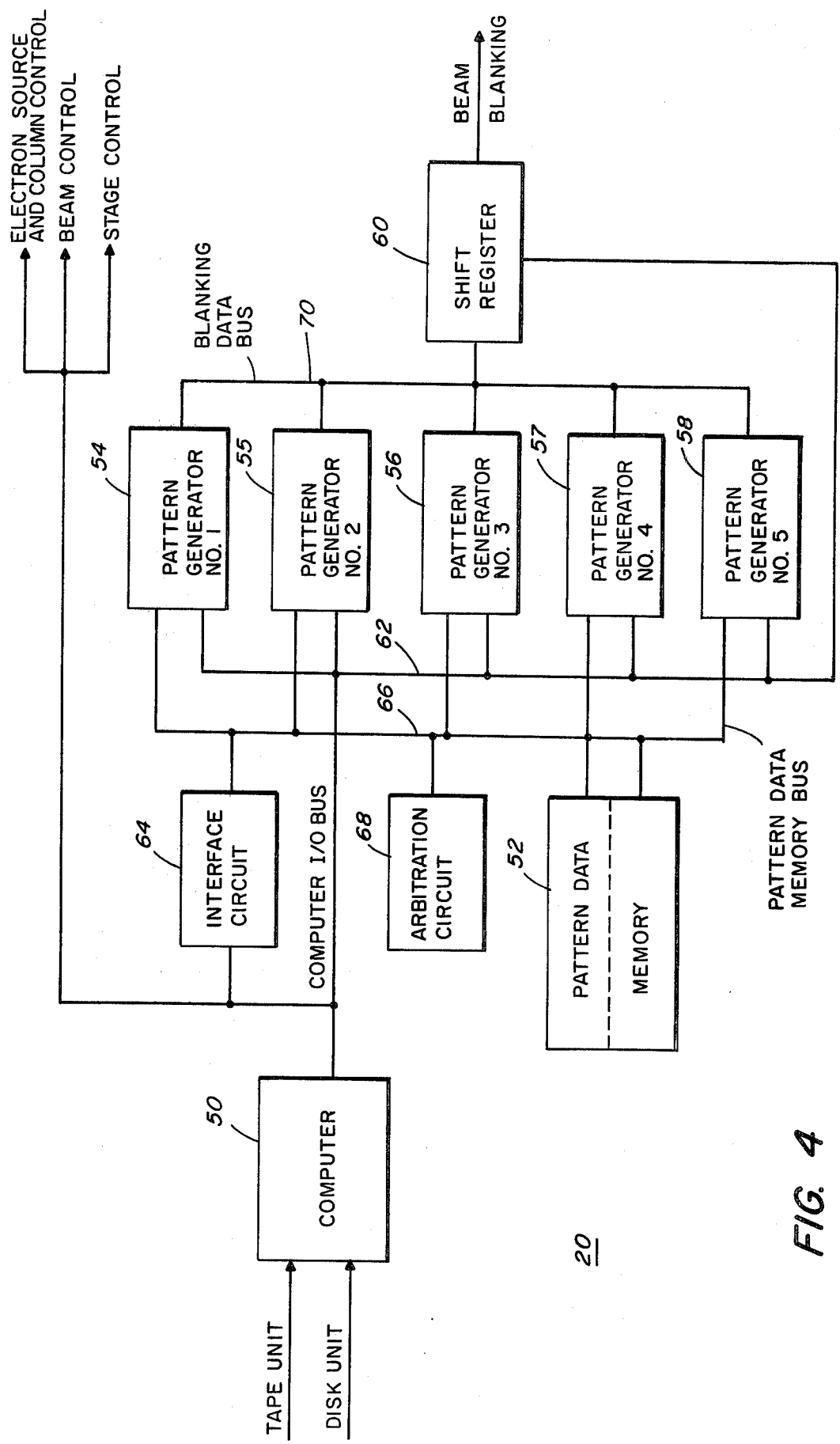
FIG. 4 is a block diagram of a data handling system in accordance with the present invention.

A data handling system 20 in accordance with the present invention is shown in block diagram form in FIG. 4. The data handling system 20 includes a computer 50, which controls the operation of the system, a pattern data memory 52 which stores blocks of figure data, a plurality of pattern generators 54, 55, 56, 57, 58 each of which converts figure data to a bit map and then transfers the bit map out through a shift register 60. The computer 50 is coupled to the tape unit 24 and to the disk unit 26. A computer I/O bus 62 is coupled to the pattern generators 54-58 and to the shift register 60 for the purpose of control. The computer I/O bus 62 is also coupled through an interface circuit 64 to a pattern data memory bus 66 and is coupled to the electron source and column control 16, the electron beam control 18, and the stage control 22. The pattern data memory bus 66 is coupled to the pattern data memory 52, the pattern generators 54-58 and an arbitration circuit 68. A blanking data bus 70 couples each of the pattern generators 54-58 to the shift register 60 input. It is to be understood that each of the above-described connections is a multiple conductor connection.

Figure 5:
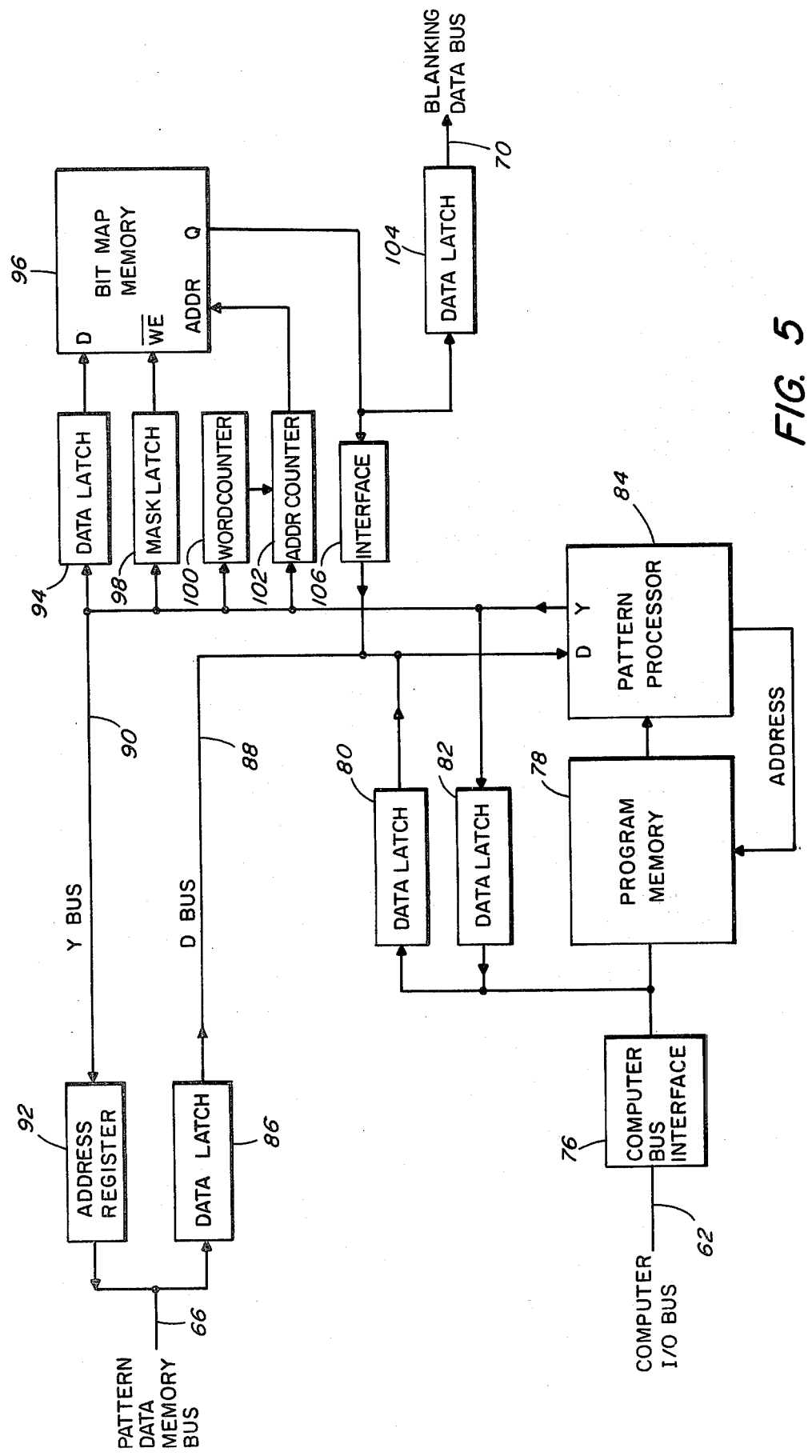
FIG. 5 is a block diagram detailing the pattern generators shown in FIG. 4.

A pattern generator typical of the pattern generators 54-58 in FIG. 4 is shown in block diagram form in FIG. 5. The computer I/O bus 62 is coupled through a computer bus interface 76 to a program memory 78, to the input of a data latch 80 and to the output of a data latch 82. The output of the program memory 78 is coupled to a pattern processor 84 which is a microprocessor. Addressing lines from the pattern processor 84 are coupled to the program memory 78. The pattern data memory bus 66 is coupled through a data latch 86 to a D bus 88 which in turn is coupled to the D input of the pattern processor 84. A Y output of the pattern processor 84 is coupled to a Y bus 90 which in turn is coupled through an address register 92 to the pattern data memory bus 66. The output of the data latch 80 is coupled to the D bus 88. The input of the data latch 82 is coupled to the Y bus 90. The Y bus 90 is coupled through a data latch 94 to the data input of a bit map memory 96 and is coupled through a mask latch 98 to the write enable input of the bit map memory 96. In addition, the Y bus 90 is coupled to the parallel load inputs of a word counter 100 and an address counter 102. The outputs of the address counter 102 are coupled to the address input of the bit map memory 96. The carry output of the word counter 100 is coupled to the inhibit input of the address counter 102. The data output of the bit map memory is coupled through a data latch 104 to the blanking data bus 70 and through an interface 106 to the D bus 88.

During operation of the data handling system 20 shown in FIGS. 4 and 5 and described hereinabove, there are three distinct operations which occur simultaneously: (1) Transfer of figure data from the tape unit 24 to the pattern data memory 52. (2) Reading of figure data from the pattern data memory 52 by all but one of the pattern generators 54–58 and conversion of the data to a bit map. (3) Transfer of data from the bit map memory 96 in the remaining one of the pattern generators 54–58 to provide beam blanking data.

Figure 6:
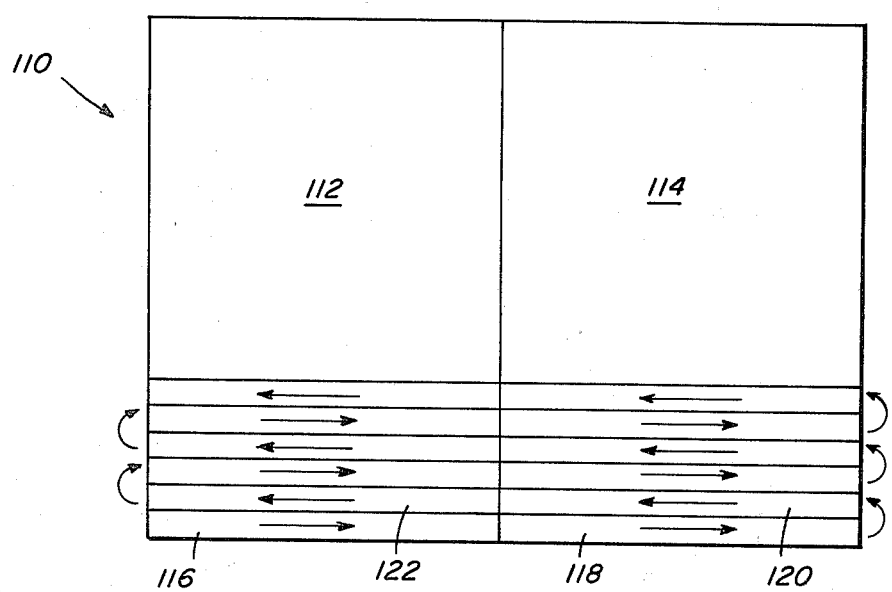

The figure data stored in the tape unit 24 corresponds to the pattern to be written on the workpiece and is organized to correspond with the writing technique to be used. The writing technique and data organization of the present system are illustrated in FIGS. 6–8. FIG. 6 shows a reticle 110 including identical die 112, 114. During exposure of the reticle 110 by the system shown in FIG. 1, a stripe area 116 and a stripe area 118 are scanned in sequence in the direction indicated. Then the moving stage shifts over and reverses direction and stripe areas 120 and 122, which abut the stripe areas 118 and 116, respectively, are scanned in sequence. The back and forth technique of scanning abutting stripe areas is repeated until the reticle 110 is completely exposed. The width of the stripe areas 116, 118, 120, 122 is limited by the scan field of the electron beam and is typically one millimeter or less. The figure data stored on tape is divided into blocks, each corresponding to a stripe area. The pattern data memory 52 has a capacity of two blocks of stripe data. In the case of reticles, features are larger in size and smaller in number than an equivalent 1X mask. Thus, the quantity of data required to describe a given pattern area is lower for reticles. In the present example, the pattern data memory has a capacity of 0.5 megabyte. Blocks of stripe data are transferred by the computer 50 through the interface circuit 64 to the pattern data memory 52.

Referring now to FIG. 7, there is shown an enlarged view of the stripe area 116 which is subdivided into multiple segments 124, 126, 128, 130. Stripe data is stored in the pattern data memory 52 such that blocks of segment figure data, corresponding to the segments of a stripe area, are independently accessible by the pattern generators 54–58. An enlarged view of the segment 124, showing the details of the raster scan, is shown in FIG. 8. A typical segment can be 1024 bits across by 244 bits in length. Thus a 250K bit map is required to specify the pattern of the segment 124. The raster scan by the electron beam is indicated by the dashed lines. In actual practice, 244 scan lines are required for the example given.

When blocks of stripe data, subdivided into blocks of segment figure data, have been loaded into the pattern data memory 52, conversion of figure data into bit maps can proceed continuously thereafter. The conversion of figure data to bit maps is performed by each of the pattern generators 54–58 under control of the computer 50. Figure data conversion routines and bit map transfer routines are downloaded from the computer 50 to the program memory 78 in each of the pattern generators 54–58. Addresses corresponding to the starting points of successive blocks of segment figure data are downloaded from the computer 50 to the respective pattern generators 54–58. Thus, for example, pattern generator 54 is given the address of the block of segment figure data corresponding to segment 124, pattern generator 55 is given the address of the block of segment figure data corresponding to segment 126, and so on.

The pattern generators are then instructed by the computer 50 to proceed with figure data conversion. The pattern processor 84 sends an address through the address register 92 to the pattern data memory 52. The addressed data word is received by the pattern processor 84 through the data latch 86. The first figure data word indicates whether the following data words describe a rectangle or a trapezoid.

The figure data is divided into rectangle descriptions and trapezoid descriptions. In each case, an x, y location, a height and a width are specified. In the case of a trapezoid, the slopes of the nonparallel sides are also specified. Each figure description occupies several words of the pattern data memory 52.

The pattern processor 84 now reads the remaining data words of the figure description and calls up either a rectangle conversion subroutine or a trapezoid conversion subroutine. The figure data words are used to generate a bit map, which is a point by point description of the figure, and to store the bit map data in the bit map memory 96.

The generation of a rectangle bit map is described with reference to FIGS. 5 and 9. In the present example, the bit map memory 96 is assumed to utilize 16 bit words. FIG. 9 illustrates a region 140 of the bit map memory 96. Each vertical stripe represents a 16 bit word having a specific address. A rectangle 142 to be mapped into the region 140 is indicated by a cross-hatched area. The rectangle 142 is located entirely within the region 140 of the bit map memory 96. A 16 bit mask word 144 is shown to the left of the region 140 for clarity of explanation. The rectangle bit map generation proceeds as follows. A starting address A1, indicating the x location of the rectangle 142, is determined by the pattern processor 84 and loaded into the address counter 102. A number L1 indicating the length of the rectangle in data words is loaded by the pattern processor 84 into the word counter 100. In the example of FIG. 9, L1 is nine words. The mask word 144, indicating the width in bits and the y location of the rectangle 142, is loaded by the pattern processor 84 into the mask latch 98. In the example of FIG. 9, the center eight bits, indicated by the darkened area, of the mask word 144 are ones. Since the outputs of the mask latch 98 are coupled to the write enable inputs of the bit map memory 96, writing of data into the unmasked bits of the data word is accomplished and masked bits of the data word remain unchanged. Thus, alteration of previously written bit map information in masked portions of the data word is inhibited. A data word consisting of all ones is loaded by the pattern processor 84 into the data latch 94. Now, writing into the bit map memory 96 and clocking of the address counter 102 and the word counter 100 proceed. The data in the mask latch 98 is written into consecutive address locations as the address counter counts. In FIG. 9, the address counter starts at address A1 and proceeds to the right. When the word counter 100 reaches a count of L1, it inhibits the address counter 102 at address A9 and writing of the rectangle 142 bit map is complete. It is noted that after loading of data into the data latch 94, the mask latch 98, the word counter 100, and the address counter 102, writing of the rectangle bit map into the bit map memory 96 is completed without intervention or control by the pattern processor 84. Thus, the pattern processor 84 is free to work on the next step of figure data conversion and the overall process of figure data conversion is speeded up.

Referring now to FIG. 10, there is illustrated the case of a rectangle 150 which overlaps word boundaries and falls partially in a region 152 of the bit map memory 96 and partially in a region 154. In this case, the above-described rectangle generation process is performed twice (or more when the rectangle is larger). A mask word 156, a starting address B1 and a number L2 representing the length (eleven in the example of FIG. 10) are loaded into the appropriate locations, as described hereinabove, and the upper portion of the rectangle 150 is written in the region 152. Next a mask word 158, starting address C1 and the number L2 are loaded into the appropriate locations, as described hereinabove, and the lower portion of the rectangle 150 is written in the region 154. In this manner, all rectangles specified by the figure data are written into the bit map memory 96 in sequence.

The conversion of trapezoid figure data to a bit map is illustrated in FIG. 11. A trapezoid 160 is written into the region 162 of the bit map memory by writing a series of lines one bit wide which combine to form a trapezoid of the desired shape. Due to the sloping sides of the trapezoid, each component line has a different length, which is calculated by the pattern processor 84 prior to writing of each line. The writing of a component line 164 of the trapezoid bit map is accomplished the same as the writing of a one bit wide rectangle, as described hereinabove. A mask word 166, containing one bit at the desired line location, is loaded into the mask latch 98. A number L3 representing the length of the line 164 is loaded into the word counter 100, a starting address D1 is loaded into the address counter 102 and the line 164 is written in the region 162. Next, the adjacent line is written in the same manner and process is repeated until the trapezoid bit map is completed.

When the bit map for a segment of a stripe area is complete, the pattern generator signals the computer 50 through the data latch 82 and the computer bus interface 76 that it is ready for reading of bit map data.

During generation of bit maps, each of the pattern generators 54-58, except for one which is reading data out to the shift register 60, accesses the pattern data memory 52 each time a new figure description is required. In addition, the computer 50 accesses the pattern data memory 52 for writing of new figure data during reading of figure data by the pattern generators 54-58. Thus, a requirement for high speed operation is placed on the pattern data memory 52 to prevent delays in the operation of the system. In one embodiment of the present invention, the pattern data memory 52 is a memory which can read or write a data word every 100 nanoseconds. Thus, the probability of one of the pattern generators 54-58 or the computer 50 having to wait for access is low. In the event that two devices attempt to access the the pattern data memory 52 at the same time, the arbitration circuit 68 permits access by one device and requires the other device to wait. The arbitration circuit 68 is a priority circuit in which a predetermined priority is assigned to each device attempting to access the pattern data memory 52.

When a pattern generator 54-58 has completed the generation and storage of a bit map, it waits for a read command from the computer 50. When the read command is given, bit map data is read out of the bit map memory 96 to the shift register 60 one data word at a time. The data word is then shifted serially out of the shift register 60 to provide beam blanking data. In order that the pattern be properly located on the workpiece, the beam blanking data must be properly sychronized to the electron beam sweep voltage. This is accomplished by sychronizing the transfer of data out of the bit map memory 96 and through the shift register 60 to the same clock which controls the electron beam sweep voltage. Prior to transfer of data from the bit map memory 96, the scan direction must be determined. With reference to FIG. 6, if the bit map memory 96 is read in one direction to expose the stripe area 116, it is clearly read in the opposite direction to expose the stripe area 122. During reading of the bit map memory 96, the pattern processor 84 addresses a data word through the address counter 102 and the data word is transferred through the data latch 104 to the shift register 60. After each electron beam scan line, the pattern processor 84 is synchronized to the shift register 60 clock. After the last line of the bit map has been transferred to the shift register 60, the pattern generator interrupts the computer 50 so that the next pattern generator can be given a read command.

The timing relationship of the pattern generators 54-58 during processing of figure data and exposure of the segments of a stripe area is illustrated in FIG. 12. The uppermost position of the diagram represents beam blanking data as a function of time for segments 1-10 of a typical stripe area. The remainder of the diagram represents the operations of the pattern generators 54-58 during exposure of the segments 1-10. It is assumed that all initialization procedures have been completed prior to the time interval shown in FIG. 12. Each of the pattern generators 54-58 alternates between processing, or conversion of figure data to a bit map, and reading of a bit map as these two operations are shown and described hereinabove. The pattern generators 54-58 read bit maps sequentially under control of the computer 50 to provide continuous beam blanking data. Thus, a bit map corresponding to segment 1 is read out of the pattern generator 54. Then a bit map corresponding to segment 2 is read out of the pattern generator 55, and so on. After each pattern generator has completed reading of a bit map to provide beam blanking data, the pattern generator proceeds with generation of a new bit map. With reference to FIG. 12, after the pattern generator 54 has read out the bit map for segment 1, it generates the bit map for segment 6, which will be called by the computer 50 after the bit map corresponding to segment 5 has been read out of the pattern generator 58. The multiplexed operation illustrated in FIG. 12 provides simultaneous conversion of figure data and exposure of the workpiece.

When five pattern generators are utilized, each pattern generator can spend up to four-fifths of its time converting figure data to bit maps. Thus, in FIG. 12 the processing of figure data for segment 6 must be completed by the time that segment 5 is complete or system delay will occur. One feature of the system shown and described hereinabove is that pattern generators can be added to or removed from the system to tailor the system operation to the desired application. For example, when the electron beam exposure rate is relatively low, two or three patterns generators can convert figure data at a sufficient rate to prevent system delay. When the electron beam exposure rate is relatively high, four or more pattern generators can be utilized to convert figure data at a higher overall rate. From the above discussion and from FIG. 12, it can be seen that the required number of pattern generators is equal to or greater than (C/T) +1 where C is the maximum figure data conversion time for a segment and T is the bit map transfer time for a segment. Another feature of the above-described data handling system is that when one of the pattern generators fails, the system can continue to operate at reduced speed. Alternatively, an additional pattern generator can be installed in the system to insure operation at maximum speed, even in the event of a pattern generator failure. The rate of operation of the exposure system is limited at some point by the speed of the pattern data memory 52 and by the speed of the writing module 10 and its associated control electronics.

It will be realized that for the above-described data handling system to provide continuous beam blanking data, the pattern data memory 52 must continuously have new figure data available for the pattern generators 54–58. This is accomplished by utilizing a pattern data memory 52 with sufficient capacity to store figure data corresponding to two consecutive stripe areas of the workpiece. Thus, at any point in time, except initially, the computer 50 can be in the process of writing new figure data for one stripe into one half of the pattern data memory 52 while the pattern generators 54–58 are simultaneously in the process of reading and converting figure data for another stripe from the other half of the pattern data memory 52. As described above, the high speed of the pattern data memory 52 prevents either the computer 50 or the pattern generators 54–58 from experiencing any significant waits for memory access.

According to one embodiment of the present invention, the computer 50 is a Nova 4 minicomputer manufactured by Data General Corporation with 64 k bytes of random access memory and the pattern data memory 52 is 512 k bytes of random access memory. In the pattern generator 54–58, the pattern processor 84 is an AM 2901 bit slice microprocessor manufactured by American Microsystems and the bit map memory 96 is a 16 k by 16 bit bipolar random access memory.

Thus, there is provided by the invention a pattern data handling system wherein figure data conversion proceeds simultaneously with electron beam exposure of a workpiece and continuous beam blanking is provided (except during repositioning of the moving stage). Therefore, the overall exposure time of workpieces is reduced as compared with systems wherein exposure of the workpiece occurs after figure data conversion. The disclosed pattern data handling system is particularly useful for the exposure of workpieces such as reticles which are characterized by little or no repetition of features and by relatively large features. Because of the bus interconnection scheme, the system configuration is easily tailored to operate at different speeds.

While there has been shown and described what is at present considered the preferred embodiment of the invention, it will be obvious to those skilled in the art that various changes and modifications may be made therein without departing from the scope of the invention as defined by the appended claims.

What is claimed is:

1. In an exposure system in which a beam selectively irradiates multiple abutting stripe areas of a workpiece, a pattern data handling system for providing beam blanking data comprising:
   memory means operative to store figure data which describes features of a pattern to be irradiated, said figure data being subdivided into multiple blocks of segment figure data, each corresponsing to a segment of one of said stripe areas; and
   processing means simultaneously operative to convert at least one of said blocks of segment figure data to a bit map containing beam blanking information for the respective segment and to serialize beam blanking information in another bit map to provide continuous beam blanking data,
   whereby figure data conversion is performed simultaneously with irradiation of said workpiece.

2. The pattern data handling system as defined in claim 1 wherein said processing means comprises:
   a plurality of pattern generators, each including a bit map memory and each operative to convert a specified block of segment figure data to a bit map and store said bit map in said bit map memory and to read said bit map out of said bit map memory at a specified time,
   control means operative to specify the blocks of segment figure data to be converted by each of said pattern generators so as to convert successive segments of a stripe area and operative to specify the time at which each of said pattern generators reads said bit map out of said bit map memory so as to provide continuous beam blanking data, and
   shift register means coupled to each of said pattern generators for serializing the bit maps read out of said bit map memories.

3. The pattern data handling system as defined in claim 2 wherein said control means further includes means for writing figure data into said memory means during conversion of figure data by said pattern generators.

4. The pattern data handling system as defined in claim 2 wherein the number of said pattern generators is equal to or greater than the ratio between the maximum figure data conversion time for a segment and the bit map read time for a segment, plus one.

5. In an electron beam exposure system in which an electron beam selectively irradiates multiple abutting stripe areas of a workpiece, a pattern data handling system for providing beam blanking data comprising:
   memory means for storage of figure data which describes features of a pattern to be irradiated, said figure data being subdivided into multiple blocks of segment figure data, each corresponding to a segment of one of said stripe areas;
   a plurality of pattern generator means, each including a bit map memory and being operative to convert a block of segment figure data from said memory means to a bit map, to store said bit map in said bit map memory and to transfer said bit map out of said bit map memory;
   shift register means, coupled to each of said pattern generator means, for serializing bit maps transferred from said pattern generator means to provide beam blanking data; and
   control means including means for loading figure data into said memory means, means for controlling the conversion of segment figure data by said pattern generator means so as to provide simultaneous conversion of multiple blocks of segment figure data and means for controlling the transfer of bit maps out of said pattern generator means and the serialization of said bit maps by said shift register means so as to provide continuous beam blanking data, whereby figure data conversion is performed simultaneously with irradiation of said workpiece.

6. The pattern data handling system as defined in claim 5 wherein each of said pattern generator means further includes pattern processor means operative to read segment figure data from said memory means and to convert said segment figure data into a series of component rectangle descriptions and rectangle generator means operative in response to each component rectangle description to store beam blanking information in said bit map memory describing said component rectangle, said component rectangles in combination defining the pattern to be irradiated on said segment.

7. The pattern data handling system as defined in claim 6 wherein said memory means, said control means and each of said pattern generator means are coupled to a memory bus on which all transfers of figure data to and from said memory means are performed and wherein said shift register means and each of said pattern generator means are coupled to a blanking bus on which all transfers of beam blanking information from said bit map memories to said shift register means are performed, whereby figure data transfers and beam blanking information transfers can occur at the same time.

8. The pattern data handling system as defined in claim 7 wherein the number of said pattern generator means is equal to or greater than the ratio between the maximum figure data conversion time for a segment and the bit map transfer time for a segment, plus one.

9. In an electron beam exposure system in which an electron beam selectively irradiates multiple abutting stripe areas of a workpiece, a method for providing beam blanking data comprising the steps of:

storing figure data, which describes features of a pattern to be irradiated, in a random access memory in which said figure data is subdivided into multiple blocks of segment figure data, each corresponding to a segment of one of said stripe areas;

converting at least one of said blocks of segment figure data to a bit map containing beam blanking information for the respective segment; and, simultaneously, serializing beam blanking information in another bit map to provide continuous beam blanking data, whereby figure data conversion is performed simultaneously with irradiation of said workpiece.

10. The method for providing beam blanking data as defined in claim 9 wherein said step of simultaneously converting a plurality of blocks of segment figure data includes the step of storing said plurality of bit maps in a corresponding plurality of bit map memories and said step of serializing said beam blanking information includes the steps of transferring said beam blanking information from said bit map memories to a shift register and then shifting said beam blanking information serially out of said shift register.

11. In an electron beam exposure system, apparatus for converting figure data, which specifies an x location, a y location, a length and a width of a rectangle to be exposed on a workpiece, into beam blanking data for subsequent serialization and blanking of said electron beam, said apparatus comprising:

bit map memory means for storage of said beam blanking data, said memory means having data words of n bits and including a write enable input for each of the n bits of said data word;

address counter means, having outputs coupled to address inputs of said bit map memory means, into which is loaded an address corresponding to the x location of said rectangle;

means for inhibiting said address counter means after said address counter means has been advanced through a number of addresses corresponding to the length of said rectangle;

mask latch means having n bit locations, each with an output coupled to one of said write enable inputs of said bit map memory means, said mask latch means being loaded with mask bits, the position of said mask bits determining the y location of said rectangle and the number of said mask bits determining the width of said rectangle; and means for advancing said address counter means through the number of addresses corresponding to the length of said rectangle, whereby beam blanking data describing said rectangle is stored in said bit map memory means and previously stored beam blanking data is not altered.

12. The apparatus as defined in claim 11 wherein said means for inhibiting said address counter means includes word counter means arranged to count the addresses accessed by said address counter means and to inhibit said address counter means when said address counter has been advanced through the number of addresses corresponding to the length of said rectangle.

13. In an exposure system in which a beam selectively irradiates multiple abutting stripe areas of a workpiece, a pattern data handling system for providing beam blanking data comprising:

memory means operative to store figure data which describes features of a pattern to be irradiated, said figure data being subdivided into multiple blocks of segment figure data, each corresponding to a segment of one of said stripe areas; and processing means simultaneously operative to convert a plurality of said blocks of segment figure data to a plurality of bit maps, each containing beam blanking information for the respective segment, and to serialize said beam blanking information in each of said bit maps, one at a time, to provide continuous beam blanking data, whereby figure data conversion is performed simultaneously with irradiation of said workpiece.

14. The pattern data handling system as defined in claim 13 wherein said processing means comprises:

a plurality of pattern generators, each including a bit map memory and each operative to convert a specified block of segment figure data to a bit map and store said bit map in said bit map memory and to read said bit map out of said bit map memory at a specified time, control means operative to specify the blocks of segment figure data to be converted by each of said pattern generators so as to convert successive segments of a stripe area and operative to specify the time at which each of said pattern generators reads said bit map out of said bit map memory so as to provide continuous beam blanking data, and shift register means coupled to each of said pattern generators for serializing the bit maps read out of said bit map memories.

* * * * *